United States Patent
Hunstig et al.

(10) Patent No.: US 11,007,601 B2
(45) Date of Patent: May 18, 2021

(54) DEVICE FOR ESTABLISHING A BONDING CONNECTION AND TRANSDUCER THEREFOR

(71) Applicant: Hesse GmbH, Paderborn (DE)

(72) Inventors: Matthias Hunstig, Paderborn (DE); Michael Broekelmann, Delbrueck (DE)

(73) Assignee: Hesse GmbH, Paderborn (DE)

( * ) Notice: Subject to any disclaimer, the term of this patent is extended or adjusted under 35 U.S.C. 154(b) by 468 days.

(21) Appl. No.: 15/318,506

(22) PCT Filed: Jul. 2, 2015

(86) PCT No.: PCT/DE2015/100277
§ 371 (c)(1),
(2) Date: Dec. 13, 2016

(87) PCT Pub. No.: WO2016/004919
PCT Pub. Date: Jan. 14, 2016

(65) Prior Publication Data
US 2017/0129046 A1    May 11, 2017

(30) Foreign Application Priority Data
Jul. 9, 2014    (DE) .................... 10 2014 109 630.4

(51) Int. Cl.
*B23K 20/00*    (2006.01)
*B23K 20/10*    (2006.01)
(Continued)

(52) U.S. Cl.
CPC .......... *B23K 20/004* (2013.01); *B23K 20/002* (2013.01); *B23K 20/106* (2013.01);
(Continued)

(58) Field of Classification Search
CPC .......... H01L 2224/85205; H01L 24/78; B23K 20/002; B23K 20/106; B23K 2101/42
See application file for complete search history.

(56) References Cited

U.S. PATENT DOCUMENTS

2009/0268326 A1    10/2009    Shelor
2011/0266329 A1    11/2011    Hesse et al.
2013/0335487 A1    12/2013    Cruze-Uribe et al.

FOREIGN PATENT DOCUMENTS

DE    102009003312 A1    4/2010

OTHER PUBLICATIONS

International Preliminary Report on Patentability dated in International Application No. PCT/DE2015/100277.
(Continued)

*Primary Examiner* — Erin B Saad
(74) *Attorney, Agent, or Firm* — Patent Central LLC; Stephan A. Pendorf

(57) ABSTRACT

A device for establishing a bonding connection, with a bonding head mounted so as to rotate about an axis of rotation, and a transducer (1) mounted on the bonding head. The transducer (1) has a piezo actuator (5) for generating ultrasonic vibration, in particular a natural ultrasonic vibration. Electrodes are (20) provided on the piezo actuator (5) in such a way that the piezo actuator (5) can be excited by an electric field in a field direction (10) transverse to a polarization direction (9) of the piezo actuator, and as a result of the excitation and of the connection of the piezo actuator (5) to the fastening section (6) and to the tool holder (3), the piezo actuator (5) carries out a shearing motion in a shearing plane (18) formed by the polarization direction (9) and by the field direction (10).

15 Claims, 8 Drawing Sheets

Figure 1:
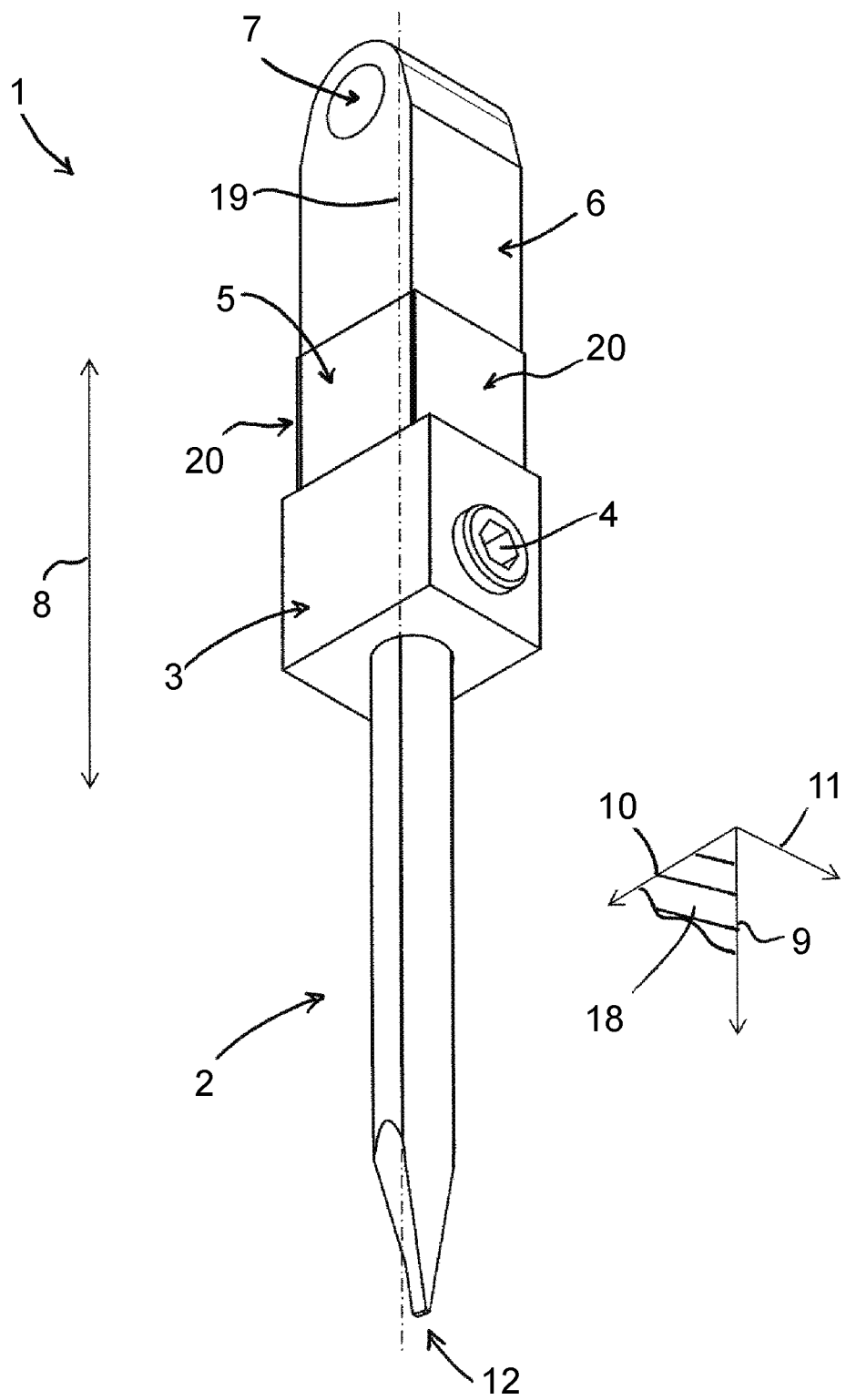

(51) Int. Cl.
*H01L 23/00* (2006.01)
*H01L 41/09* (2006.01)
*B23K 101/42* (2006.01)

(52) U.S. Cl.
CPC .............. *H01L 24/78* (2013.01); *H01L 24/85* (2013.01); *H01L 41/0993* (2013.01); *B23K 2101/42* (2018.08); *H01L 2224/78347* (2013.01); *H01L 2224/78621* (2013.01); *H01L 2924/00014* (2013.01)

(56) References Cited

OTHER PUBLICATIONS

International Search Report dated Nov. 1, 2016, in International Application No. PCT/DE2015/100277.

DEVICE FOR ESTABLISHING A BONDING CONNECTION AND TRANSDUCER THEREFOR

The invention relates to a device for producing a bonding connection, including a bonding head mounted so as to rotate about an axis of rotation, and a transducer mounted on the bonding head, wherein the transducer has a piezo actuator for exciting ultrasonic vibration, in particular a natural ultrasonic vibration, a fastening section for attaching the transducer to the bonding head and a tool holder for a bonding tool, wherein in the longitudinal extension of the transducer and/or an extension of the same in the direction of an axis of a minimum inertial moment extends parallel to the axis of rotation of the bonding head.

Furthermore, the invention relates to a transducer, in particular for a device for producing a bonding connection, with a transducer body, a piezo actuator fixed to the transducer body and electrodes provided on the piezo actuator, wherein the transducer body has a fastening section for fixing the transducer to a receptacle of a machine tool and a tool receptacle for a tool which can be attached to the transducer.

Conventional bonding devices usually provide for positioning the transducer and a bonding tool attached to the transducer at a 90° angle to one another. While the bonding tool extends parallel to a rotational axis of a bonding head carrying the transducer, the transducer is provided transversely to the axis of rotation of the bonding head in relation to a main longitudinal direction or longitudinal direction thereof. This design of the bonding device has proven itself in principle and has been widely used in practice for many years. However, the dynamics in positioning or moving the bonding head is limited due to the orientation of the transducer. One is therefore endeavored to improve the dynamic properties of the bonding device by means of a suitable design of the transducer. In particular, it is necessary to increase the positioning speed for the bonding head or to improve the positioning accuracy. Additional bonding connections can then be produced in the same amount of time. This improves the efficiency of the bonding device. Furthermore, efforts are being made to reduce the set-up pulse when the tool tip is placed on the bonding wire by reducing the weight of the bonding head or the transducer held thereon, thereby avoiding damage to the bonding wire or the substrate.

It is known from DE 10 2009 003 312 A1 to fasten a transducer to a bonding device in such a way that the axis of rotation of the bonding head is oriented parallel to the longitudinal direction of the transducer or a direction of extension thereof in the direction of an axis of a minimum mass moment of inertia. This makes it possible to improve the dynamics of the bonding device. The bonding head with the ultrasonic transducer held thereon can be positioned correspondingly quickly and precisely. The bonding tool extends in this case in the longitudinal direction of the transducer. As part of the transducer, a plurality of piezo actuators are provided which are excited phase-shifted by 180° in such a way that in the transducer and the bonding tool connected therewith a bending vibration is excited as an ultrasonic vibration. As a result of the ultrasonic vibration, a bonding wire, which is positioned at a tip of the bonding tool and pressed against a substrate, can be electrically conductively connected to the substrate.

Viewed macroscopically, the tip of the bonding tool performs a longitudinal vibration in the wire direction. With regard to the piezoactor, the document discloses two basically different concepts. On the one hand, two piezo actuators spaced apart from one another are used. The piezo actuators are phase-shifted in such a way that a first actuator expands in a longitudinal direction thereof while a second actuator is compressed in its longitudinal direction. The two piezo actuators are connected to one another on the front side in such a way that the required ultrasound vibration is formed on the transducer as a result of the periodic movement of the piezo actuators. On the other hand, it is disclosed that disk-shaped piezo actuators are applied to opposite sides of a carrier body and are excited phase-shifted. As one actuator expands, the other actuator is compressed on the opposite side. As a result, the carrier body and with it the transducer and the bonding tool held therein are excited to the ultrasonic vibration. It is common to both embodiments that a longitudinal expansion or compression of the piezo actuators or of the piezoceramics provided herein is used to produce the ultrasonic vibration. An electric field used to excite the piezo actuators is oriented parallel to a polarization direction of the piezoceramics. The actuator movements used to excite the ultrasonic vibration then lie parallel to the electric field or transversely thereto. One speaks of the fact that the piezo actuators provided for exciting the ultrasonic vibration use the 31-effect or the 33-effect.

The object of the present invention is to further develop a bonding device with a bonding head and an ultrasonic transducer which is held thereon in such a way that, keeping the good dynamic properties, new design possibilities arise, in particular with respect to the structure of the transducer and the arrangement of the piezo actuator. It is also an object to further reduce the weight of the transducer.

In order to achieve the object, the invention is characterized, in connection with the preamble of claim 1, in that electrodes are provided on the piezo actuator such that the piezo actuator can be excited in a field direction by means of an electric field transversely to a direction of polarization thereof and that the piezo actuator, as a result of excitation and a connection thereof to the fastening section and to the tool receptacle, carries out a shearing movement in a shearing plane formed by the polarization direction and the field direction. In particular, this leads to the result that the transducer performs the ultrasonic vibration as a natural vibration and/or bending vibration. For example, the ultrasonic vibration takes place around an axis of rotation oriented perpendicular to the shear plane.

The particular advantage of the invention is that, as a result of the excitation of a vibration in the piezo actuator, new possibilities for the integration thereof into the transducer are provided. The underlying principle represents a deviation from conventional thinking. Basically it applies that, using a right-handed Cartesian coordinate system, the polarization of the piezoceramic occurs in 3-directions. In the present case, the electric field is applied perpendicularly thereto in the 1-direction. As a result of the shear motion, an ultrasonic vibration is then excited perpendicular to the 2-direction in the shear plane. The piezo actuator is located in a node of the ultrasonic vibration. On the other hand, the electric field has always been applied in the direction of polarization in the case of resonant, that is to say in an ultrasonic transducer operated in its own mode, and either the change in length in the field direction or perpendicular thereto is used in the excitation of the ultrasound vibration.

As a result of the use of the shearing movement in the shear plane, the transducer according to the invention can be operated with a single piezo actuator. The provision of two piezo actuators controlled in phase opposition is not required. As a result, the transducer can be made very slender in a longitudinal direction thereof. The dynamics of the bonding device are further improved insofar as the transducer can be produced at low cost. Further, the electrical control of the transducer is simplified when a single piezo actuator is provided. In addition, the space requirement is reduced, with the result that the positioning of the bonding head in the working space of the bonding device is simplified. Furthermore, degrees of freedom are also provided with regard to the arrangement of the electrodes. Here the electrodes can be offset by 90° to the polarization direction of the piezoceramic. Correspondingly, the accessibility of the electrodes can be improved. Furthermore, the piezo actuator can be pre-stressed. This increases the robustness of the arrangement and the piezo actuator can be operated with higher vibration amplitudes than a non-pretensioned piezo actuator.

The piezo actuator can be connected positively (form-fitting), non-positively (force-fitting) and/or materially (adhesively) to the tool holder or the fastening section. Depending on the application, various possibilities exist for the integration of the piezo actuator into the transducer. For example, the piezo actuator can be glued to the tool holder or the fastening section. This results in a two-dimensional connection, and the possibility of transferring the shearing movement of the piezo actuator to the adjacent components such that the transducer as well as a bonding tool held thereon are excited to an ultrasonic vibration in the shear plane. The provision of the gluing requires very little space and promotes the miniaturization of the transducer.

According to a development of the invention, the piezo actuator can be provided clamped against the tool receptacle or the fastening section. A jamming can, for example, be realized during assembly by using the different thermal expansion coefficients of the materials involved. For example, a clamping module can be provided for clamping the piezo actuator. In particular, the clamping module can be implemented in a mechanically adjustable manner. For example, wedges, which are provided to be displaceable relative to each other, can be implemented as part of the clamping module. For example, movable clamping jacks and an actuating means for the clamping jacks, for example a cam, can be provided for realizing the clamping of the piezo actuator. For example, screws for clamping or fixing the piezo actuator can be used.

According to a further development of the invention, planar contact surfaces are formed on two opposite sides of the piezo actuator. The piezo actuator is applied with the flat contact surfaces to correspondingly designed connecting surfaces of the tool holder, the fastening section or the clamping module. The geometry of the contact surfaces on the piezo actuator and the correspondingly designed connection surfaces on the tool receptacle, the fastening section or the clamping module are designed in such a way that the torsion-resistant connection is realized. Advantageously, a robust design of the transducer results from the provision of suitable contact surfaces. The vibration carried out in the shear plane is reliably transmitted to the adjacent components in such a way that the ultrasonic vibration is transmitted in the transducer and the bonding tool fixed thereon, and a bonding wire guided in the region of a tool tip and pressed against a substrate is bonded to the substrate. The contact surfaces as well as the connection surfaces can be geometrically simple. The simple design of the surfaces promotes manufacturability.

According to a further development of the invention, a transducer body is provided as part of the transducer. A recess is provided on the transducer body into which the piezo actuator and optionally the clamping module are inserted. In particular, the tool receptacle and the fastening section are realized as part of the transducer body. Advantageously, the integration of the piezo actuator into the transducer is simplified by the provision of the recess. The result is a robust, permanent structure for the transducer. The piezo actuator is thereby virtually an integral component of the transducer body. Interfacial surfaces of the recess can, for example, serve as connecting surfaces of the tool receptacle, the fastening section or the clamping module, which correspond to the planar contact surfaces of the piezo actuator. In addition, the number of parts is reduced by the provision of the transducer body and the integration of the tool holder and the fastening section. The tool receptacle and the fastening section have a defined relative position to each other and to the piezo actuator inserted in the recess. The ultrasonic vibration, which for example forms as a bending vibration on the transducer and the bonding tool held thereon, is correspondingly exact.

In order to achieve the object, the invention is characterized, in combination with the pre-characterizing portion of claim 14, in that the electrodes are positioned on the piezo actuator in such a way that the piezo actuator can be excited transversely to a polarization direction thereof in a field direction by means of an electric field and that the piezo actuator, as a result of the excitation, performs a shear motion as an ultrasonic vibration in a shear plane formed by the polarization direction and the field direction. In particular, this leads to the result that the transducer performs the ultrasonic vibration as a natural vibration and/or bending vibration. For example, the ultrasonic vibration takes place around an axis of rotation oriented perpendicular to the shear plane.

The particular advantage of the invention is that the piezo actuator according to the invention is small and compact and thus has a low weight. When the transducer is attached to a bonding head or a receptacle of another machine tool, good dynamic properties and a low weight are achieved. The transducer can, for example, be used in bonding devices. For example, the transducer can be used for ultrasonically assisted soldering or ultrasonically assisted cleaning of components.

Further advantages, features and details of the invention can be taken from the further subclaims and the following description. Characteristics mentioned there can each respectively be relevant to the invention, either individually or in any desired combination. Characteristics and details of the device described in accordance with the invention are, of course, also related to the transducer according to the invention and vice versa. Thus, the disclosure of the individual aspects of the invention can always be referred to as interchangeable. The drawings are provided by way of example only and are not intended to be limiting.

Exemplary embodiments of the invention are explained in more detail below with the aid of drawings.

There is show in:

FIG. 1 a perspective view of a transducer according to the invention with a piezo actuator in a first embodiment.

Figure 2:
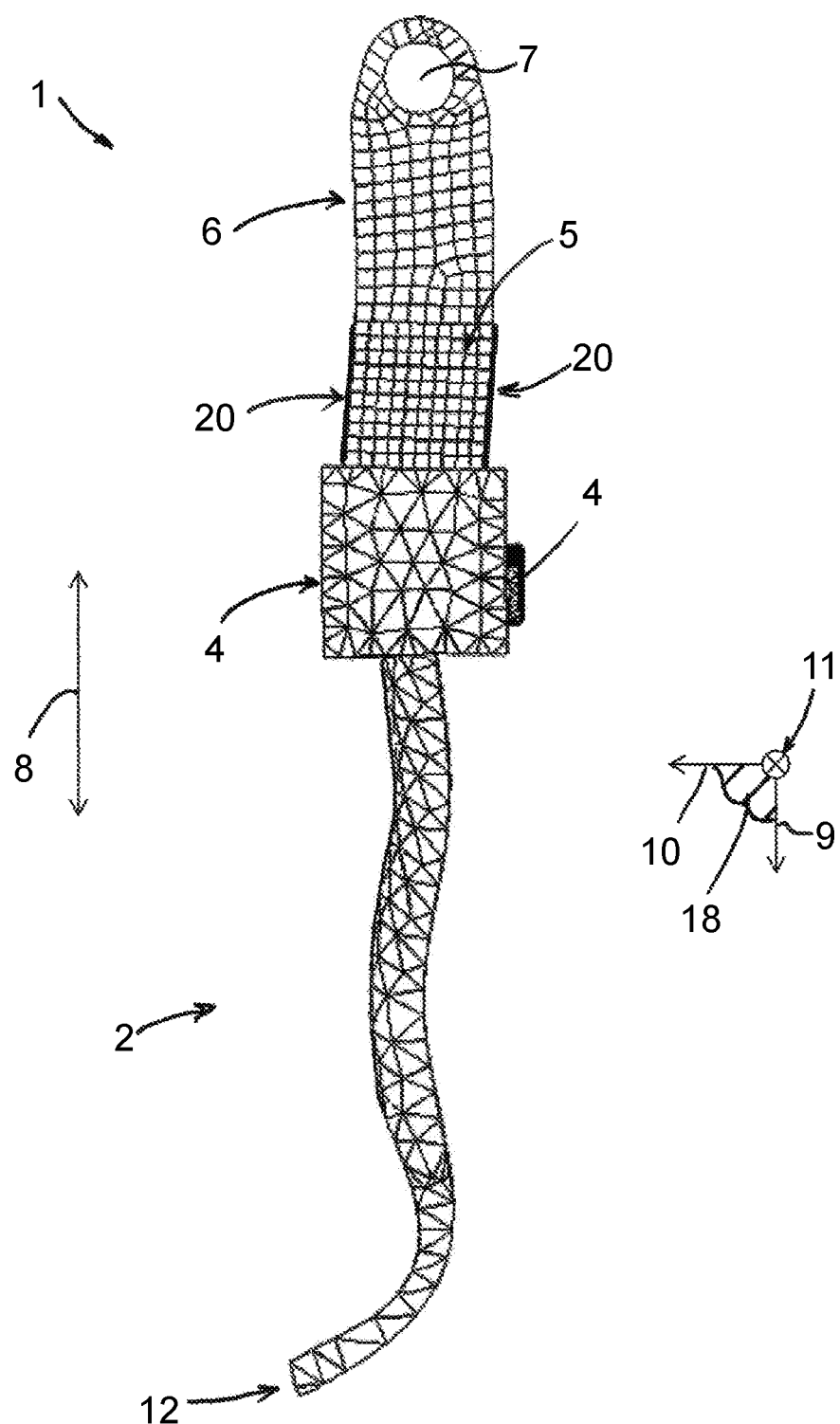
Figure 3:
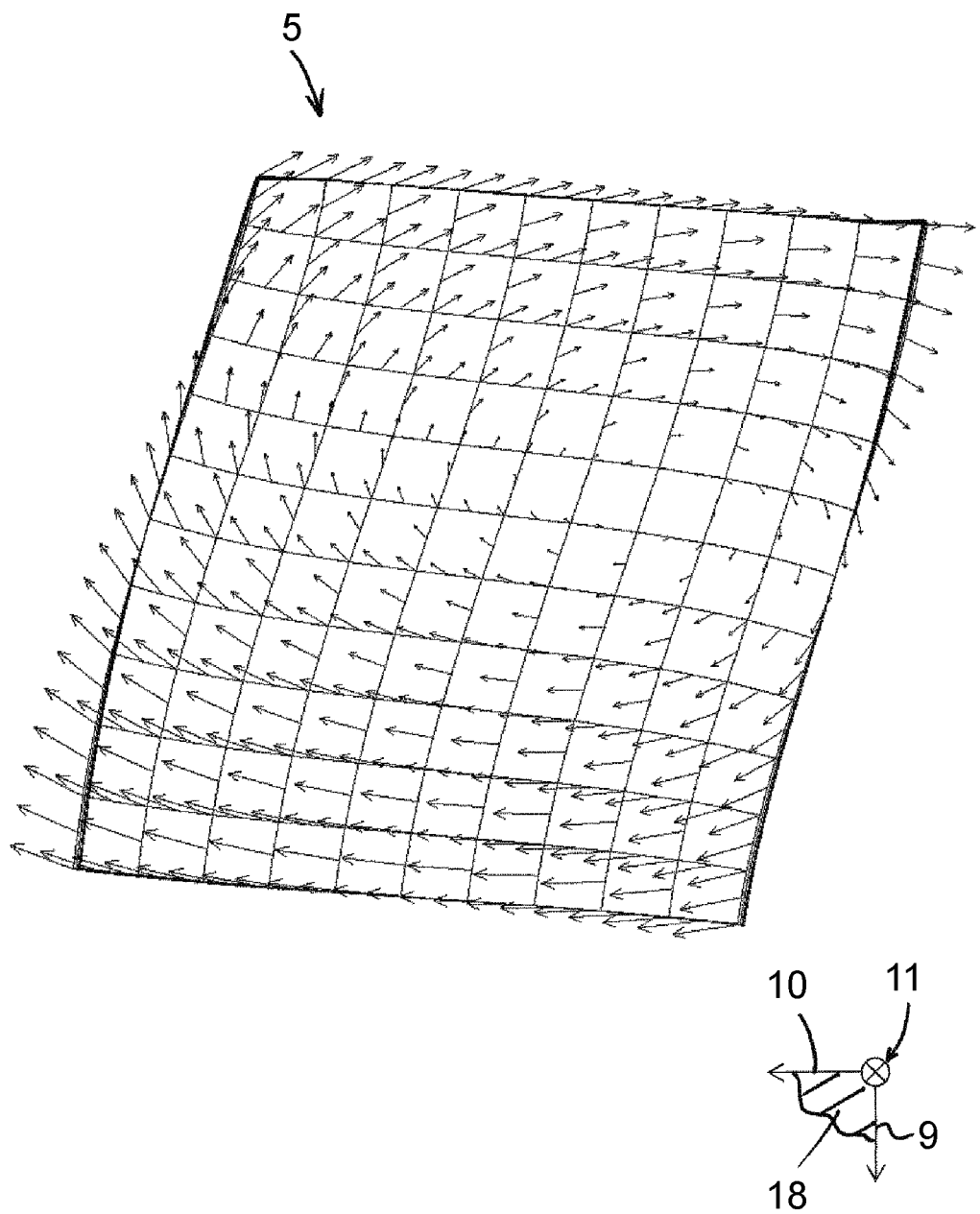
Figure 4:
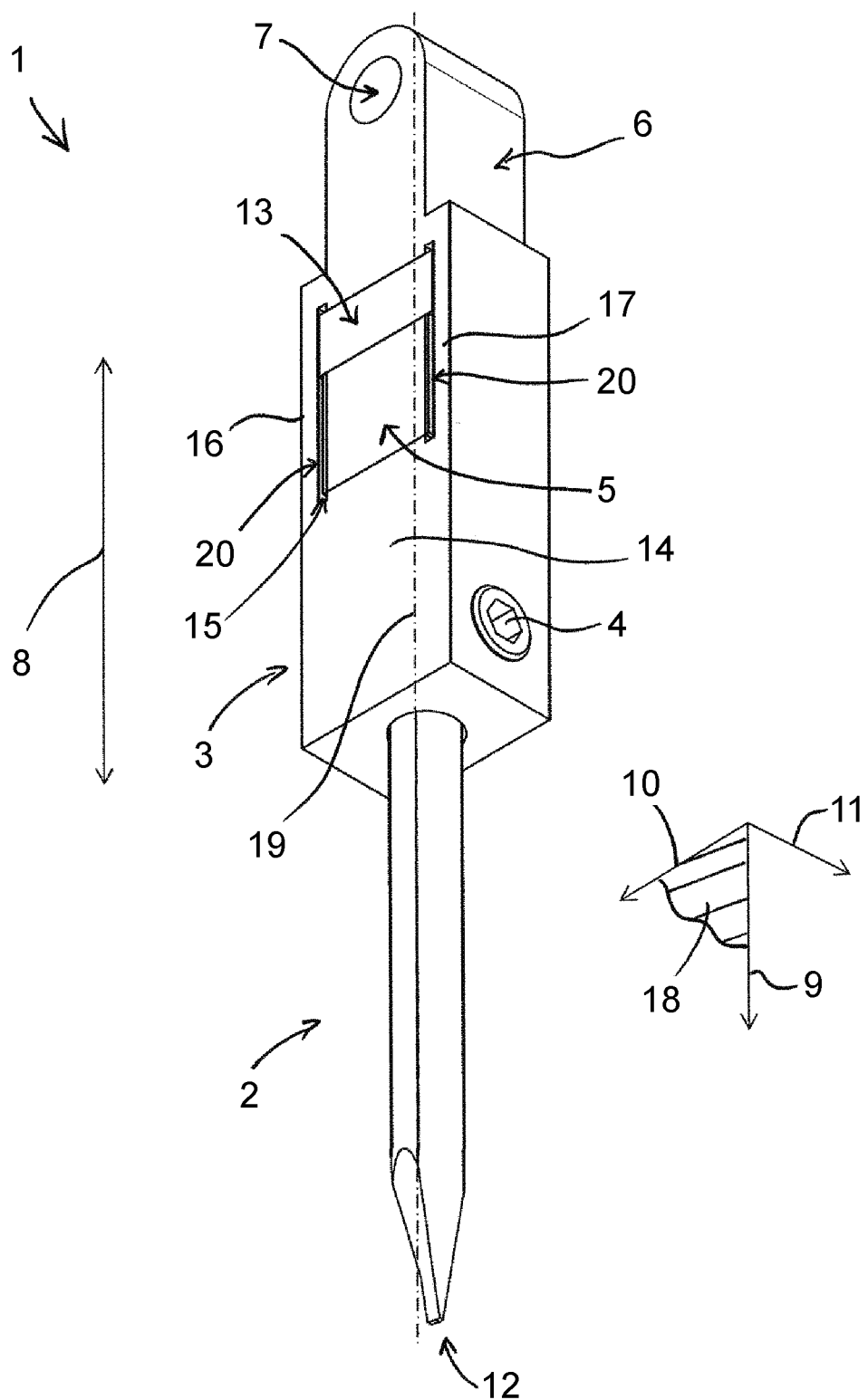
Figure 5:
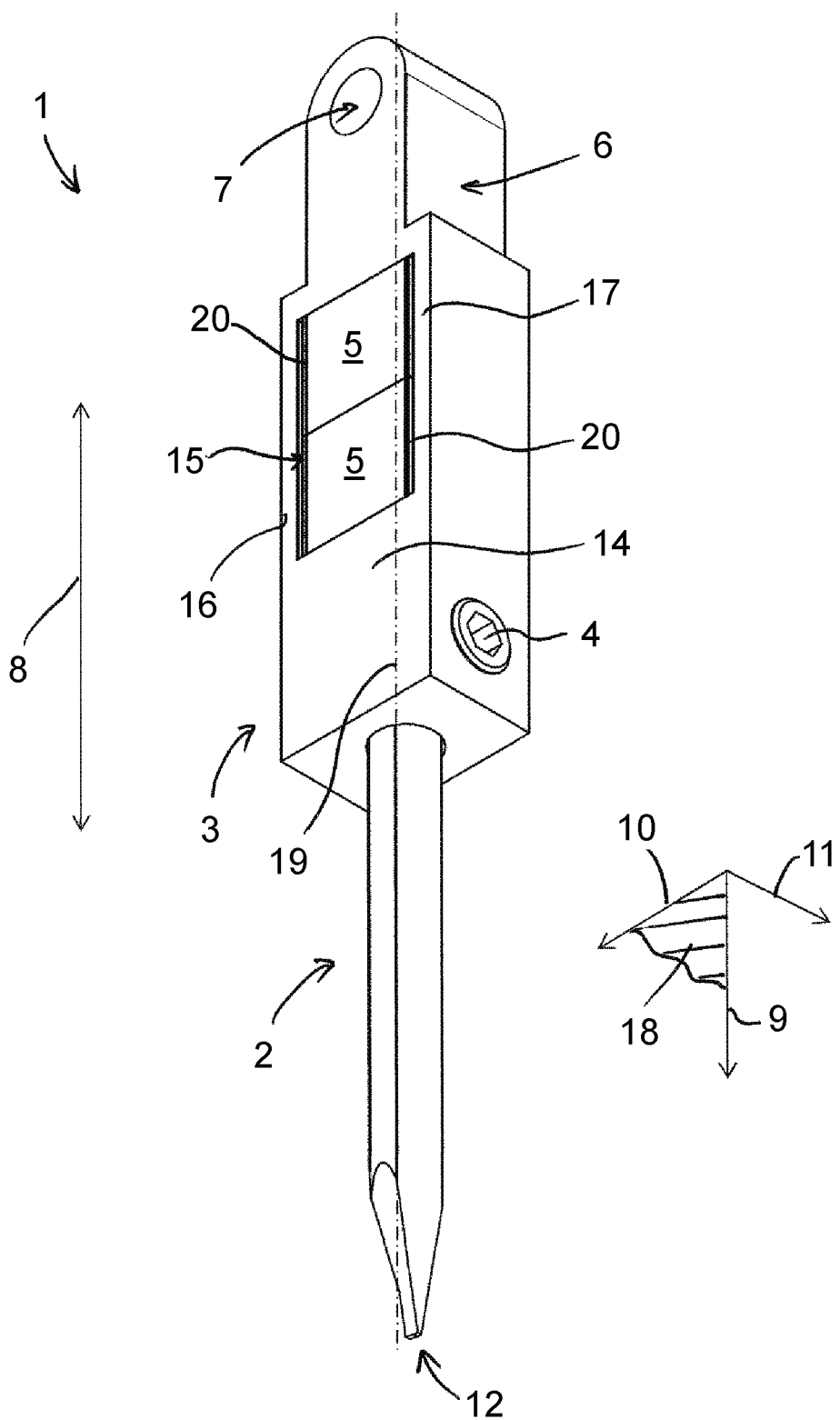
Figure 6:
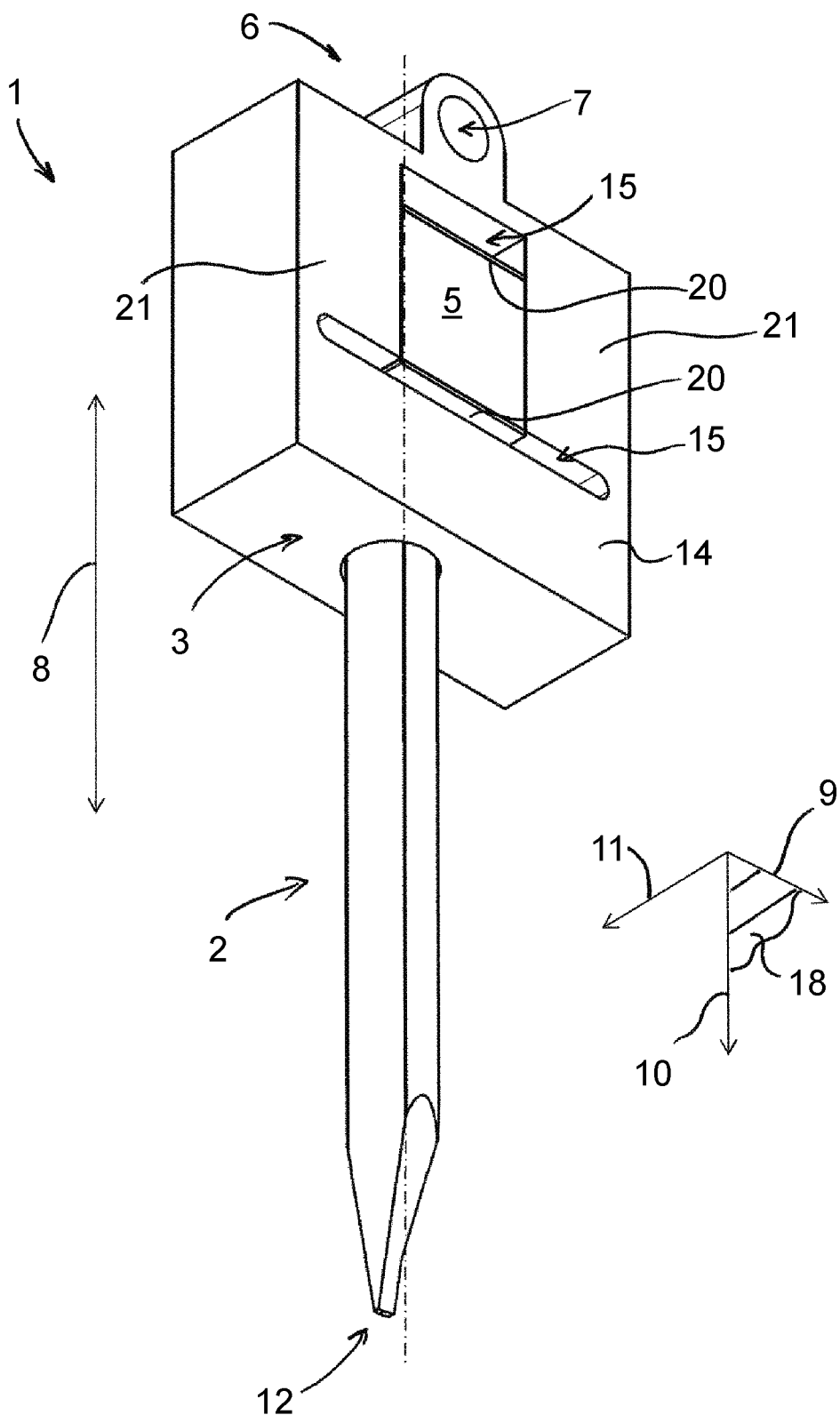
Figure 7:
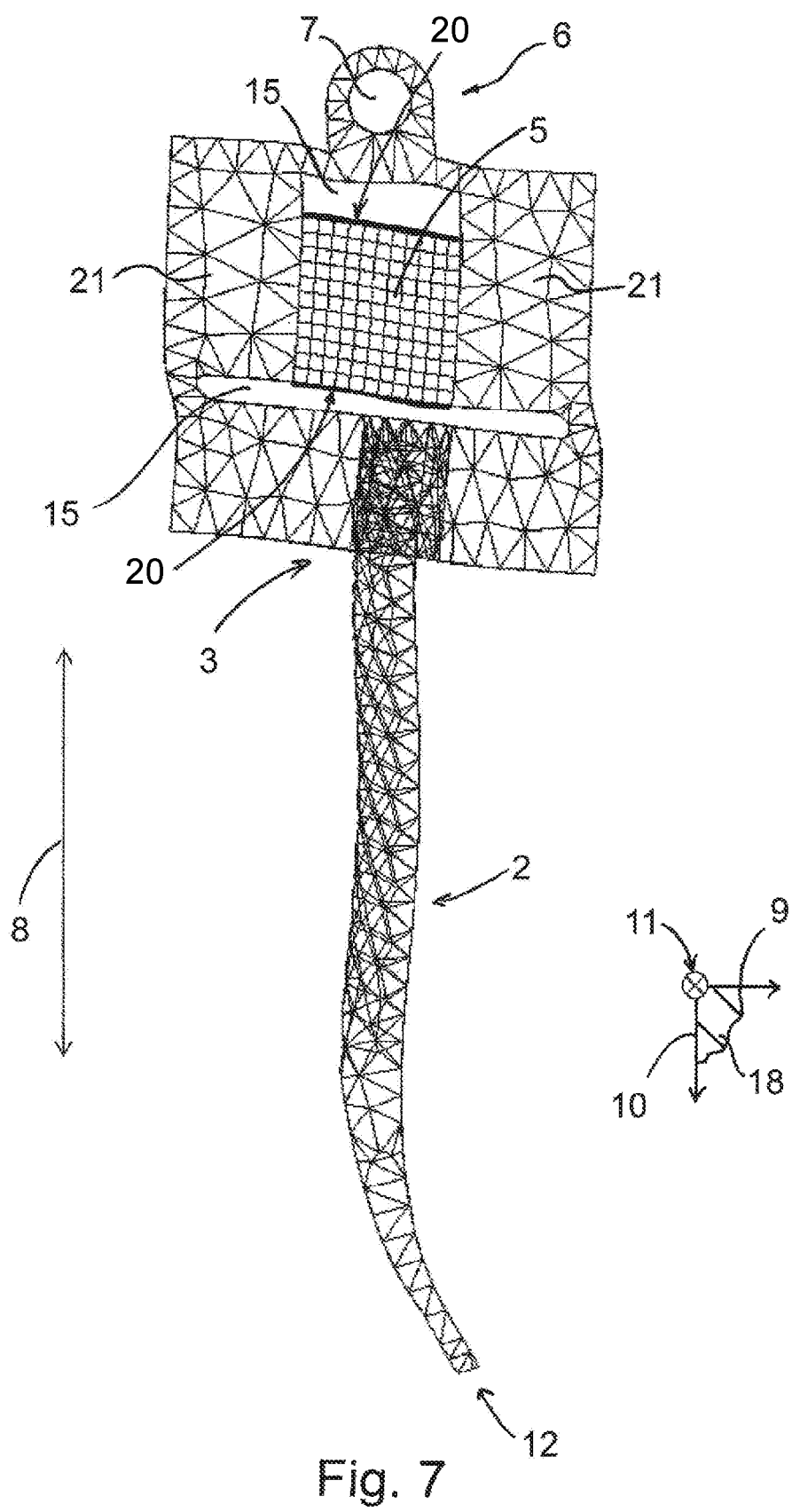
Figure 8:
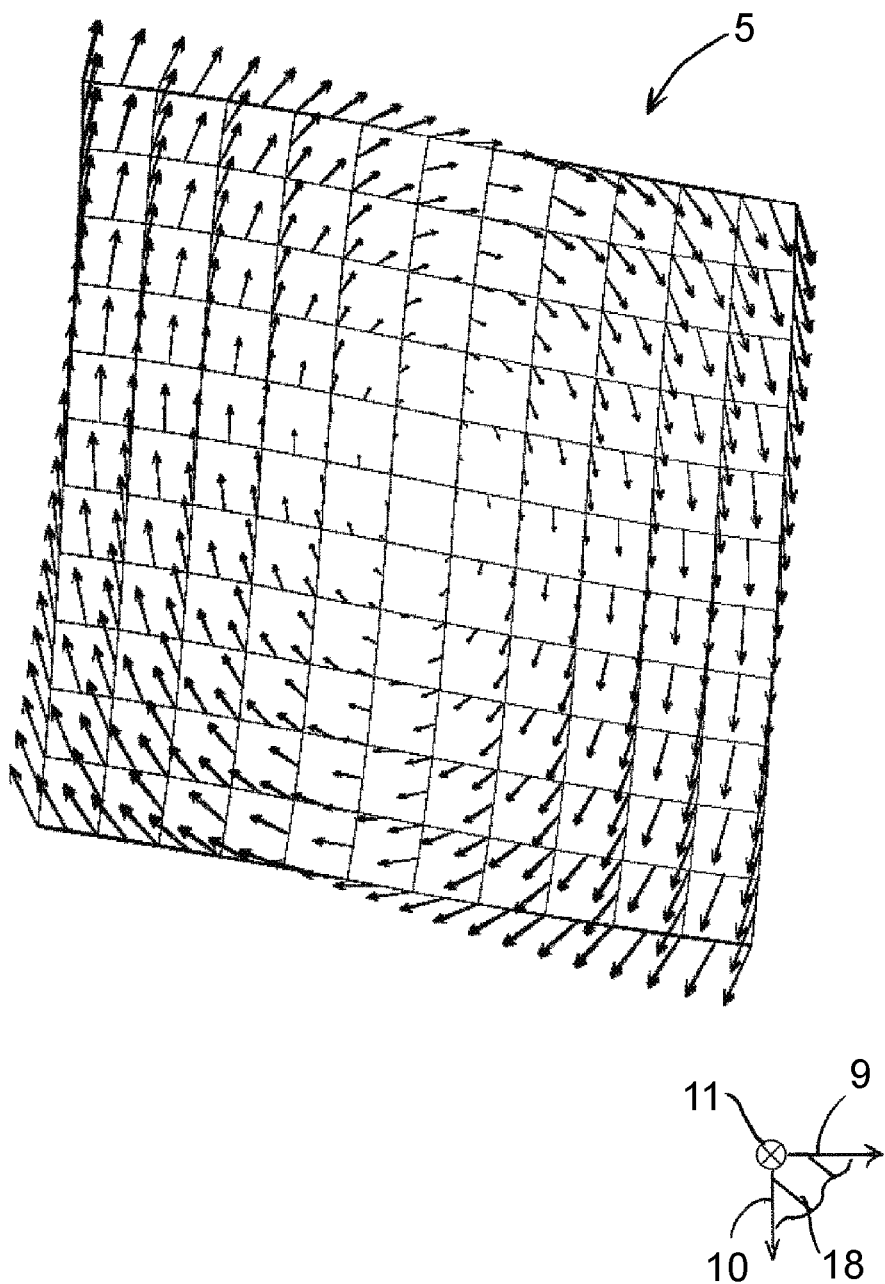

FIG. 2 a vibration representation for the transducer according to FIG. 1 in an excited state, FIG. 3 an enlarged view of the piezo actuator of the transducer of FIG. 1 in the excited state according to FIG. 2, FIG. 4 a perspective view of the transducer according to the invention in a second embodiment, FIG. 5 a perspective view of the transducer according to the invention in a third embodiment;

FIG. 6 a perspective view of the transducer according the invention in a fourth embodiment, FIG. 7 a vibration representation for the transducer according to FIG. 6 in an excited state and FIG. 8 an enlarged view of the piezo actuator of the transducer according to FIG. 6 in the excited state according to FIG. 7.

A transducer 1 according to the invention according to FIG. 1 is fixed on a bonding head of a bonding device. The bonding head is positioned relative to a substrate via various actuators of the bonding device. With the transducer 1 according to the invention, a bonding wire is then bonded to the substrate. For this purpose, an elongated bonding tool 2, which is designed to taper on a side facing away from the transducer 1 and forms a tool tip 12, is fixed on a tool receptacle 3 of the transducer 1. In the region of the tool tip 12 the bonding wire is positioned and pressed against the substrate. In order to fix the bonding tool 2, the transducer 1 has a tool receptacle 3. The bonding tool 2 is detachably held on the tool receptacle 3 by means of a screw 4. The piezo actuator 5 is excited by means of two electrodes 20 provided on opposite sides of the piezo actuator 5.

As part of the transducer 1, a fastening section 6 with a bore 7 is also provided. The fastening section 6 is for fixing the transducer 1 to the bonding head of the bonding device. In particular, the transducer 1 is held on the bonding head in the region of the bore 7 of the fastening section 6 by means of suitable connecting means. A piezo actuator 5 is provided between the fastening section 6 on the one hand and the tool holder 3 on the other hand. The piezo actuator 5 is of parallelepipedal shape. It has planar contact surfaces on two opposite sides. With planar contact surfaces the piezo actuator 5 abuts the correspondingly configured connecting surface of the fastening section 6 on the one hand and a correspondingly designed connecting surface of the tool holder 3 on the other hand. The connection of the piezo actuator 5 with the tool holder 3 on the one hand and the fastening section 6 on the other hand is produced, in particular, by adhesive bonding. For this purpose, the opposing planar contact surfaces of the piezo actuator 5 are adhesively bonded to the correspondingly configured connecting surfaces of the tool receptacle 3 or the fastening section 6.

In a mounted state, the transducer 1 is fixed to the bonding head of the bonding device such that a longitudinal direction 8 of the transducer 1 is oriented parallel to a rotation axis of the bonding head. At the same time, an axis of a minimum mass moment of inertia 19 extends parallel to the longitudinal direction 8 of the transducer 1. In this respect, the axis of the minimum moment of inertia 19 is also oriented parallel to the axis of rotation of the bonding head. A distance between the axis of the minimum mass moment of inertia 19 of the transducer 1 and the axis of rotation of the bonding head, which is determined transversely to the longitudinal direction 8, is small. More preferably, the axis of the minimum mass moment of inertia 19 is coaxial with the axis of rotation of the bonding head. The corresponding positioning of the transducer 1 on the bonding head improves the dynamics of the bonding device. In particular, the bonding head can be positioned particularly quickly and rotated about the rotational axis. Accordingly, many bondings can be produced per unit of time and the use of the bonding device is economically advantageous.

FIG. 2 shows the piezo actuator 5, which excites an ultrasonic vibration of the transducer 1 extended in the longitudinal direction 8 and of the bonding tool 2 in a shearing plane 18. The piezo actuator 5 or a geometric center thereof is preferably positioned in a node of the ultrasonic vibration. Likewise, the bore 7 of the mounting portion 6 is provided in a node of the ultrasonic vibration. The connection of the transducer 1 to the bonding head takes place in the region of a vibration node. Likewise, the bonding tool 2 is preferably fixed in the region of a vibration node in the tool receptacle 3, whereby the excitation of the bonding tool 2 is performed rotationally. An antinode of vibration is located at the tip 12 of the bonding tool 2. The ultrasonic vibration, which is excited by the piezo actuator 5 and transmitted by the transducer 1 to the bonding tool 2, thus causes a maximum relative movement between the substrate and a bonding wire held on the tip 12 of the bonding tool 2 and pressed against a substrate.

The fastening of the transducer 1 via the bore 7 is merely exemplary. According to an alternative embodiment of the invention, which is not shown, the transducer 1 can be fixed via a thread, glued, clamped or otherwise attached to a receptacle of a machine tool. Furthermore, it can be provided that the fastening takes place outside a vibration node.

According to an alternative embodiment of the invention (not shown), the bonding tool 2 can be fixed on the tool holder 3 outside a vibration node of the ultrasonic vibration. The excitation of the bonding tool 2 is then not purely rotary, but by a superimposed rotary and linear vibration. The linear vibration is oriented in particular transversely to the longitudinal direction 8 of the transducer 1.

In order to excite the vibration form shown in FIG. 2 in the transducer 1 and the bonding tool 2, the piezo actuator 5 performs an ultrasonic vibration in the shear plane 18 as shown in FIG. 3. The piezo actuator 5 is polarized in a polarization direction 9. An electric field is applied perpendicularly to the polarization direction 9 in a field direction 10 on the piezo actuator 5. To provide the electric field, the electrodes 20 are provided on the piezo actuator 5. As a result of the polarization in the polarization direction 9 and the applied electric field transversely thereto, an ultrasonic vibration is performed in the shear plane 18 defined by the polarization direction 9 and the field direction 10. In particular, this leads to the result that the transducer 1 performs the ultrasonic vibration as a natural vibration or bending vibration. For example, the ultrasonic vibration takes place around an axis of rotation 11 oriented perpendicular to the shear plane 18 (corresponds to the 2-direction). The shear motion of the piezo actuator 5 in the shear plane 18 generates the ultrasonic vibration in the transducer 1 and the bonding tool 2. In the present case, the longitudinal direction 8 extends in the shearing plane 18, or as the case may be, the polarization direction 9 extends in the longitudinal direction 8.

An alternative embodiment of the inventive transducer 1 according to FIG. 4 provides a transducer body 14 having the fastening section 6 and the tool receptacle 3. A recess 15, which is designed in the manner of a perforation extending in the direction of the axis of rotation 11, is provided on the one-piece transducer body 14. The piezo actuator 5 is positioned in the recess 15 on the one hand. In addition, a clamping module 13 is provided in the recess 15, which serves to connect the piezo actuator 5 to the transducer body 14 in a force-locking manner. For this purpose, the clamping module 13 has clamping wedges which are not individually shown and which are held relative to each other and are fixed in such a way that the piezo actuator 5 is retained in the recess 15 in a force-fitting manner. A shearing motion performed by the piezo actuator 5 excites the ultrasonic vibration used in the transducer 1 and the bonding tool 2 in a known manner to produce the bonding connection between the bonding wire and the substrate.

A first leg 16 and a second leg 17 are provided on the transducer body 14 in the region of the recess 15. The first leg 16 and the second leg 17 connect the fastening section 6 and the tool holder 3 with one another. They extend in the longitudinal direction 8 of the transducer 1 and are comparatively compliant. In particular, the legs 16, 17 are provided at a distance from the piezo actuator 5 on opposite sides thereof. The opposing contact surfaces of the piezo actuator 5 abut on the tool receptacle 3 on the one hand and a correspondingly configured connecting surface of the clamping module 13 on the other hand. The clamping module 13 is provided between the piezo actuator 5 and the fastening section 6 of the transducer 1.

According to an alternative, non-illustrated embodiment of the invention, the clamping module 13 can be provided between the piezo actuator 5 and the tool holder 3 of the transducer 1. The recess 15 can be dispensed with, the legs 16, 17 can be applied directly to the piezo actuator 5 or the electrodes 20 and can be insulated therefrom.

According to an alternative embodiment of the invention according to FIG. 5, the transducer 1 has two piezo actuators 5 provided in the recess 15. The piezo actuators 5 are designed in such a way that they form a shearing motion in the shearing plane 18 as ultrasonic vibration. Together, they stimulate the ultrasonic vibration of the transducer 1 and the bonding tool 2.

The piezo actuators 5 are held in the recess 15 in a force-fit or friction-locked manner. For example, the different coefficients of thermal expansion of the piezoceramics used for producing the piezo actuators 5, on the one hand, and the transducer body 14 preferably made of a metallic material, are used for the force-fit or friction-locked reception of the piezo actuators 5 in the recess 15.

A fourth embodiment of e transducer 1 according to the invention is shown in FIGS. 6 to 8. The transducer 1 has a transducer body 14, in which the piezo actuator 5 is fixed. The polarization direction 9 is perpendicular to the longitudinal direction 8 of the transducer 1. The electric field is applied in the longitudinal direction 8, that is to say, the field direction 10 is parallel to the longitudinal direction 8.

The piezo actuator 5 is fixed on the transducer body 14 via two lateral cheeks 21 of the transducer body 14. For example, the piezo actuator 5 is clamped between the cheeks 21. For example, the piezo actuator 5 is glued with the cheeks 21. The opposing electrodes 20 are provided adjacent to two recesses 15 which favor the development of a vibration of the piezo actuator 5 in the shearer plane 18 which is stressed by the polarization direction 9 and the field direction 10.

To fix the tool 2 on the transducer body 14, by way of example a screw 4 is dispensed with. For example, the tool 2 is fixed on the tool holder 3 of the transducer body 14 by means of clamping.

To illustrate the invention, the representation of h transducer 1 in the illustrated embodiments is limited to the aspects and features which are essential to the invention. Further components can be provided on the transducer 1. The piezo actuator 5 is shown in principle. For example, a piezo actuator 5 produced from a single piezoceramic system can be provided. For example, the piezo actuator 5 can have a plurality of disc-shaped piezoceramics. For example, the piezo actuator 5 can be designed in the manner of a piezostatic actuator.

Identical components and component functions are identified by the same reference symbols.

The invention claimed is:
1. A device for producing a bonding connection, comprising
    a bonding head mounted so as to rotate about an axis of rotation,
    a transducer (1), mounted on the bonding head, the transducer (1) comprising a piezo actuator (5) for exciting an ultrasonic bending vibration,
    a fastening section (6) for securing the transducer (1) to the bonding head, and
    a tool holder (3) for a bonding tool (2),
    wherein a longitudinal extension (8) of the transducer (1) and/or a direction of extension thereof in the direction of an axis of a minimum inertial moment (19) runs parallel to the axis of rotation of the bonding head,
    wherein electrodes (20) are provided on opposite sides of the piezo actuator (5) in such a way that the piezo actuator (5) is excited to resonance by an electric field in a field direction (10) transverse to a polarisation direction (9) of the piezo actuator, and
    wherein the piezo actuator (5), as a result of excitation and connection thereof to the fastening section (6) and to the tool holder (3), produces a shearing movement in a shearing plane (18) formed by the polarization direction (9) and the field direction (10).
2. The device as claimed in claim 1, wherein the piezo actuator (5) is form-fitting and/or force-fitting non-positively and/or adhesively connected to the tool holder (3) and/or the fastening section (6).
3. The device according to claim 1, wherein the piezo actuator (5) is clamped against the tool holder (3) and/or the fastening section (6).
4. The device according to claim 1, wherein a clamping module (13) is provided for clamping the piezo actuator (5), said clamping module being mechanically adjustable.
5. The device according to claim 4 wherein the piezo actuator (5) has a cuboid shape and/or has a planar contact surface on two opposing sides for applying the piezo actuator (5) to a correspondingly designed connection surface of the tool holder (3) and/or the clamping module (13) and/or the fastening section (6).
6. The device according to claim 1, wherein the piezo actuator (5) is adhered to the tool holder (3) and/or the fastening section (6).
7. The device according to claim 1, wherein the transducer (1) has a transducer body (4) and the transducer body (14) is provided with a recess (15), wherein the piezo actuator (5) is provided in the recess (15) of the transducer body (14).
8. The device according to claim 1, wherein the recess (15) is designed in the manner of a breakthrough recess (15) extending in the direction of the axis of rotation (11).
9. The device according to claim 1, wherein the tool holder (3) and/or the fastening section (6) are part of the transducer body (14) and/or the piezo actuator (5) is provided between the tool holder (3) and the fastening portion (6).
10. The device according to claim 1, wherein the piezo actuator (5) is provided in the node of the executed ultrasonic vibration.
11. The device according to claim 1, wherein a bore of the tool holder (3) is provided in a node of the executed ultrasonic vibration that is performed and/or the tool is fixed in the node on the tool holder (3).
12. The device according to claim 1, wherein the rotation axis of the bonding head is provided coaxially with the axis of the minimum mass moment of inertia (19) of the transducer (1).

13. The device according to claim 1, wherein the piezo actuator (5) is connected warp resistant to the fastening section (6) and/or the tool holder (3).

14. A device for producing a bonding connection, comprising
- a bonding head mounted so as to rotate about an axis of rotation,
- a transducer (1), mounted on the bonding head, the transducer (1) comprising a piezo actuator (5) for exciting an ultrasonic vibration,
- a fastening section (6) for securing the transducer (1) to the bonding head,
- a bonding tool (2), and
- a tool holder (3) for the bonding tool (2),
- wherein a longitudinal extension (8) of the transducer (1) and/or a direction of extension thereof in the direction of an axis of a minimum inertial moment (19) runs parallel to the axis of rotation of the bonding head,
- wherein the piezo actuator (5) has a cuboid shape and has a planar contact surface on two opposing sides, respectively, wherein electrodes (20) are provided on planar opposite sides of the piezo actuator (5) parallel to each other in such a way that the piezo actuator (5) is excited to resonance by an electric field in a field direction (10) transverse to a polarisation direction (9) of the piezo actuator, and
- wherein the piezo actuator (5), as a result of excitation and connection thereof to the fastening section (6) and to the tool holder (3), produces a shearing movement in a shearing plane (18) formed by the polarization direction (9) and the field direction (10), wherein the shearing movement of the piezo actuator (5) in the shear plane (18) generates the ultrasonic bending vibration in the transducer (1) and the bonding tool (2).

15. The device according to claim 1, wherein the piezo actuator (5) is of parallelepipedal shape.

* * * * *